United States Patent
Hart et al.

(10) Patent No.: US 10,919,158 B2
(45) Date of Patent: Feb. 16, 2021

(54) THREE-DIMENSIONAL ELECTROMECHANICAL ADHESIVE DEVICES AND RELATED SYSTEMS AND METHODS

(71) Applicant: MASSACHUSETTS INSTITUTE OF TECHNOLOGY, Cambridge, MA (US)

(72) Inventors: Anastasios John Hart, Waban, MA (US); Sanha Kim, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 194 days.

(21) Appl. No.: 16/268,381

(22) Filed: Feb. 5, 2019

(65) Prior Publication Data
US 2019/0240845 A1    Aug. 8, 2019

Related U.S. Application Data

(60) Provisional application No. 62/626,490, filed on Feb. 5, 2018.

(51) Int. Cl.
*H01T 23/00* (2006.01)
*B25J 15/00* (2006.01)
(Continued)

(52) U.S. Cl.
CPC ......... *B25J 15/0085* (2013.01); *B81B 3/0054* (2013.01); *H02N 13/00* (2013.01); *B81B 2201/13* (2013.01)

(58) Field of Classification Search
None
See application file for complete search history.

(56) References Cited

U.S. PATENT DOCUMENTS

| 6,113,768 A | 9/2000 | Fuhr et al. |
| 10,316,220 B2* | 6/2019 | Hawkes ............... C09J 7/00 |

(Continued)

FOREIGN PATENT DOCUMENTS

WO    2018/129272 A1    7/2018

OTHER PUBLICATIONS

Hawkes, Elliot W., et al., "Dynamic Surface Grasping with Directional Adhesion", IEEE/RSJ International Conference on Intelligent Robots and Systems, 7 pages, (Nov. 2013).

(Continued)

*Primary Examiner* — Stephen W Jackson
(74) *Attorney, Agent, or Firm* — Nutter McClennen & Fish LLP

(57) ABSTRACT

Controllable electromechanical adhesive devices including three-dimensional dielectrically-coated microstructures that are mechanically compliant are provided. The microstructures can be controlled to provide tunable electromechanical surface adhesion, allowing for dexterous gripping of microscale and/or macroscale objects. For example, the devices can tune the surface adhesion strength of one or more microstructures without complex mechanical actuation in a wide range of on/off ratios with low voltage. The devices can be configured as a force sensor capable of providing tactile feedback for determining the load applied against the microstructures by the surface of an object. For example, the devices can provide output indicative of changes in an electrical property of one or more microstructures for determining the applied load of an object. The devices can be pixelated or otherwise configured to provide localized force sensing and/or surface adhesion. Related systems and methods for controlling the disclosed electromechanical adhesive devices are also described.

20 Claims, 9 Drawing Sheets

(51) Int. Cl.
*B81B 3/00* (2006.01)
*H02N 13/00* (2006.01)

(56) References Cited

U.S. PATENT DOCUMENTS

| | | | |
|---|---|---|---|
| 10,483,878 B2 * | 11/2019 | Heinz | H02N 13/00 |
| 2005/0012577 A1 | 1/2005 | Pillans et al. | |
| 2008/0089002 A1 | 4/2008 | Pelrine et al. | |
| 2008/0169003 A1 * | 7/2008 | Curtis | B03C 3/68 |
| | | | 134/1 |
| 2011/0193362 A1 | 8/2011 | Prahlad et al. | |
| 2014/0016177 A1 | 1/2014 | Aizenberg et al. | |
| 2016/0023904 A1 | 1/2016 | Hart et al. | |

OTHER PUBLICATIONS

Sahay, Rahul, et al, "A state-of-the-art review and analysis on the design of dry adhesion materials for applications such as climbing micro-robots", RSC Adv., 2015, 5, 50821, pp. 50821-50832 (May 28, 2015).

Dadkhah, Mohammad, et al, "A Self-Aligning Gripper Using an Electrostatic/Gecko-Like Adhesive", IEEE/RSJ International Conference on Intelligent Robots and Systems (IROS), pp. 1006-1011 (Oct. 9-14, 2016).

Guo, Jianglong, et al.,"Toward Adaptive and Intelligent Electroadhesives for Robotic Material Handling", IEE Robotics and Automation Letters, vol. 2, No. 2, pp. 537-545 (Apr. 2017).

International Search Report and Written Opinion for Application No. PCT/US 19/16704, 15 pages, (United States Patent and Trademark Office, dated Jun. 3, 2019).

Shintake, Jun, et al., "Versatile Soft Grippers with Intrinsic Electroadhesion Based on Multifunctional Polymer Actuators", Advanced Materials, 28, pp. 231-238 (2015).

Murphy, Michael P, et al., "Gecko-Inspired Directional and Controllable Adhesion, vol. 5, No. 2, pp. 170-175 (2009)".

Murphy, Michael P., et al., "Small Supporting Information Gecko Inspired Directional and Controllable Adhesion", Department Mechical Engineering, Carnegie Mellon University (sic), 5 pages, Supplementary videos (under "Supporting Information") found at <https://onlinelibrary.wiley.com/doi/abs/10.1002/smll.200801161>.

Shintake, Jun, et al., "Supporting Information Versatile Soft Grippers with Intrinsic Electroadhesion Based on Multifunctional Polymer Actuators", Advanced Materials, 6 pages (2015), Supplementary videos (under "Supporting Information") found at <https://www.onlinelibrarywiley.com/action/downloadSupplement?doi=10.1002%2Fadma.201504264&file=adma201504264-sup-0002-S2.mp4.

* cited by examiner

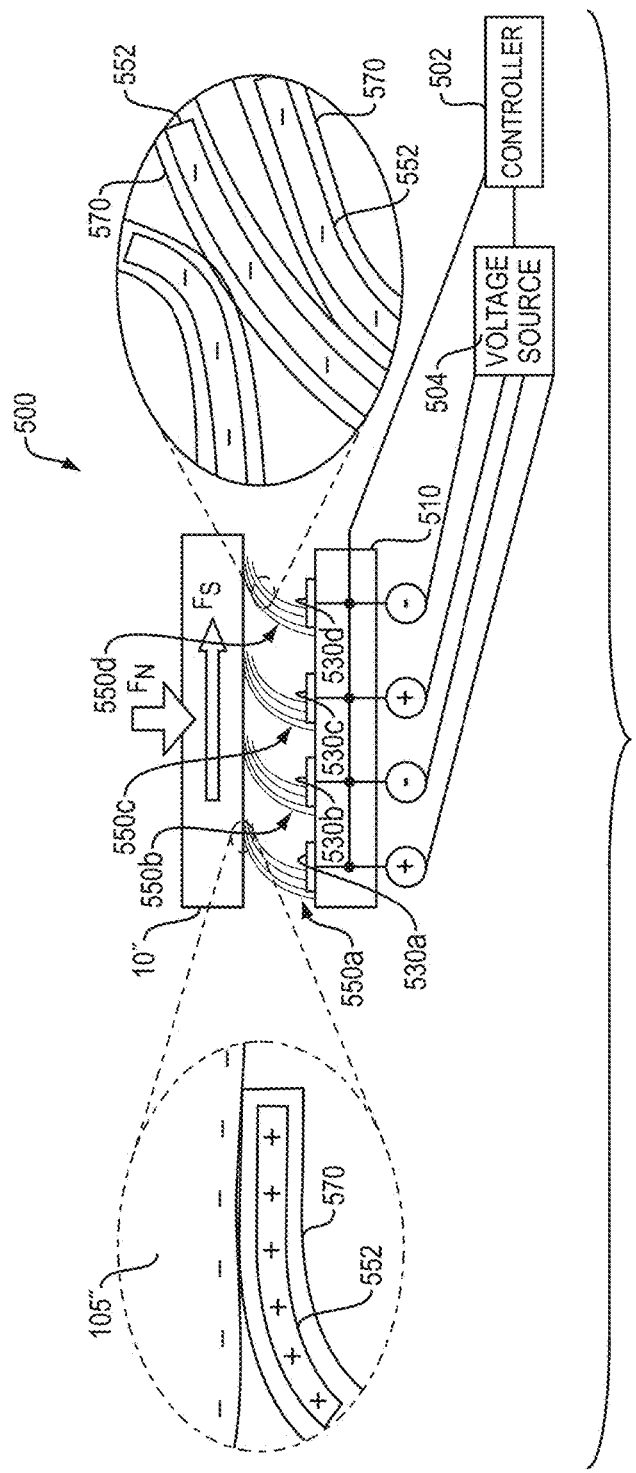
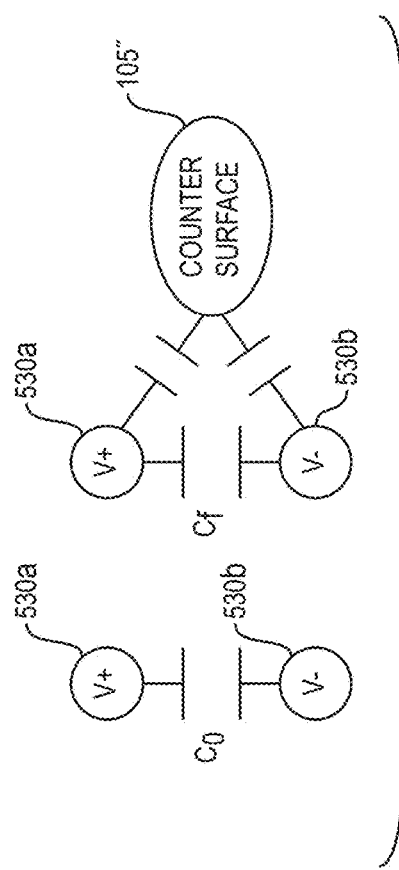
FIG. 5A
FIG. 5B

THREE-DIMENSIONAL ELECTROMECHANICAL ADHESIVE DEVICES AND RELATED SYSTEMS AND METHODS

RELATED APPLICATIONS

This application claims the benefit of U.S. Provisional Patent Application No. 62/626,490, filed on Feb. 5, 2018, the entire contents of which are incorporated herein by reference.

FIELD

The present disclosure relates to systems, devices, and methods for sensing and gripping objects, and more particularly to controllable adhesive devices, and related systems and methods, having three-dimensional (3D) conductive microstructures capable of electromechanically engaging with objects for gripping/adhesion, force sensing, and surface topological analysis, among other actions.

BACKGROUND

Controllable adhesive surfaces and/or devices capable of providing controlled surface adhesion can be useful for robotic grippers or other automatic materials handling systems. For example, conventional bio-mimetic adhesive devices, such as gecko-inspired dry adhesive devices, are usually driven by hierarchical architectures of fibrillary structures. Such structures typically rely on surface contact forces, e.g., van der Waals force, to facilitate mechanical surface adhesion in a reversible way. For example, the tunability (sometimes referred to as switchability) of such mechanical adhesive devices can be controlled by manipulating the contact area between the fibrillary structures and the target surface via directional deformation of the structures. However, adjusting the mechanical surface adhesion usually involves precise actuation with controlled forces in specific directions. Such complex operation can limit the speed and versatility to handle objects having various shapes and sizes.

Some conventional devices and/or surfaces can provide controlled surface adhesion using electrostatic attraction. Conventional electrostatic adhesive devices are typically two-dimensional (2D) planar devices having embedded interdigitated electrodes covered with a thin dielectric coating. Without complex actuation, electrostatic attraction forces can be generated and tuned by applying different external voltages through adjacent electrodes for electrostatically adhering to a surface of an object in contact with the device. However, such conventional electrostatic adhesive devices typically require very high operating voltages (e.g., greater than 1 kilovolt) to achieve sufficient adhesion strength and on/off ratio for gripping.

Accordingly, there is a need for improved systems, devices, and methods capable of providing controlled surface adhesion for sensing and/or gripping objects.

SUMMARY

The present disclosure describes various embodiments of controllable electromechanical adhesive devices having three-dimensional (3D) hierarchical microarchitectures. The disclosed adhesive devices can include dielectrically-coated 3D microstructures that are mechanically compliant (e.g., bendable and/or deformable). The disclosed microstructures can be controlled to provide switchable or tunable electromechanical surface adhesion, e.g., for dexterous gripping of microscale and/or macroscale objects. For example, in some embodiments, the device can be configured to tune the surface adhesion strength of one or more of the conductive microstructures without complex mechanical actuation in a wide range of on/off ratios (e.g., greater than about 200) with low operation voltage (e.g., less than about 100 volts). Alternatively, or additionally, the disclosed electromechanical adhesive devices can be configured as a force sensor capable of providing tactile feedback that can be processed to determine the shear/normal forces applied against the microstructures by the surface of an object. For example, the devices can provide output indicative of changes in an electrical property of one or more microstructures for determining the applied force of an object. In some embodiments, the devices can be pixelated or otherwise configured to provide localized force sensing and/or surface adhesion.

Related systems and methods for controlling the disclosed electromechanical adhesive devices are also described. In some embodiments, a controller or control unit can be configured to process the output of one or more of electromechanical adhesive devices for determining the forces applied by the object and respectively tuning the adhesion strength of the device(s) based on the determined forces. Alternatively, or additionally, a controller or control unit can be configured to process the output of one or more electromechanical adhesive devices to determine the surface topology of an object. In some embodiments, the determined surface topology of a target object can be useful for locating a desirable surface location to position and/or orient the one or more electromechanical adhesion devices prior to gripping.

In one exemplary embodiment of a device, the device includes a substrate, a plurality of three-dimensional (3D) conductive microstructures disposed on the substrate, a dielectric coating disposed on an outer surface of the plurality of conductive microstructures, and a plurality of electrodes disposed on the substrate. Each electrode of the plurality of electrodes is electrically coupled to at least one of the plurality of conductive microstructures. The plurality of 3D conductive microstructures are configured to deform when in contact with a surface of an object. Further, the plurality of conductive microstructures are configured to electromechanically adhere to a surface of an object when voltage is applied to the plurality of conductive microstructures through the plurality of electrodes. The device is configured to provide an output for determining a force applied by a surface of an object against the plurality of conductive microstructures, with the output being indicative of a change in an electrical property of one or more of the plurality of conductive microstructures. Still further, the device is configured to set the voltage that is applied to the plurality of conductive microstructures to induce electromechanical adhesion based on the determined force applied by the surface of the object against the plurality of conductive microstructures.

The output for determining a force applied by a surface of an object can be indicative of a capacitance and/or a resistance that changes in response to deformation of one or more of the plurality of conductive microstructures. The plurality of conductive microstructures can be configured to deform when in contact with a surface of an object such that the plurality of conductive microstructures provide a contact area that conforms substantially to the surface of the object. The dielectric coating can be conformally disposed on the outer surface of the plurality of conductive microstructures.

The plurality of conductive microstructures can be configured to release the object when the voltage is removed. In some embodiments, each of the plurality of conductive microstructures can include one or more of a plurality of conductive fibers, conductive nanowires, conductive nanorods, and/or conductive nanotubes. At least some conductive microstructures of the plurality of conductive microstructures can be slanted and/or curved with respect to a top surface of the substrate. In some such embodiments, one or more of the slanted and/or curved conductive microstructures can be slanted and/or curved with respect to the top surface of the substrate in a substantially identical direction for anisotropic lateral adhesion. Alternatively, or additionally, one or more of the slanted and/or curved conductive microstructures can be slanted and/or curved with respect to the top surface of the substrate in different directions for isotropic lateral adhesion.

In some embodiments, the plurality of conductive microstructures can be disposed on the substrate in a plurality of groups of conductive microstructures. Each group can include one or more conductive microstructures of the plurality of conductive microstructures. In some such embodiments, the voltage applied to electromechanically adhere the plurality of conductive microstructures to a surface of an object can be controlled by selectively applying the voltage to the plurality of groups of conductive microstructures on a per group basis. The voltage applied to each of the plurality of groups of conductive microstructures can be determined based on a force applied by a surface of an object against the one or more conductive microstructures of that group. In some such embodiments, the device can be configured to provide the output for determining a force applied by a surface of an object against each of the plurality of groups of conductive microstructures. The output for determining a force applied by a surface of an object against a group of conductive microstructures can correspond to at least one of a capacitance or a resistance that is associated with the group of conductive microstructures.

In some embodiments, a controller can also be provided. The controller can be configured to set the voltage that is applied to the plurality of conductive microstructures to induce electromechanical adhesion based on the determined force applied by the surface of the object against the plurality of conductive microstructures.

The controllable adhesive device can be a component of a robotic gripping system. In some instances, the robotic gripping system can be wearable.

One exemplary method of manipulating an object includes contacting a controllable adhesive device against a surface of an object. The controllable adhesive device includes a substrate, a plurality of three-dimensional (3D) conductive microstructures disposed on the substrate, a dielectric coating disposed on a surface of the plurality of conductive microstructures, and a plurality of electrodes electrically coupled to the plurality of conductive microstructures. The method further includes determining a force applied by the surface of the object against the plurality of conductive microstructures. The determination is based on a change in an electrical property of one or more of the plurality of conductive microstructures.

In some embodiments, the force applied by the surface of the object against the plurality of conductive microstructures is determined based on a capacitance and/or a resistance that changes in response to deformation of one or more of the plurality of conductive microstructures.

The method can also include applying voltage to the plurality of conductive microstructures to induce electromechanical adhesion between the plurality of conductive microstructures and the surface of the object. In some such embodiments, the method can also include controlling the voltage applied to the plurality of microstructures for inducing electromechanical adhesion based on the determined force applied by the surface of an object. Further, the method can include releasing the object by removing the voltage from the plurality of conductive microstructures.

In embodiments that include applying voltage to the plurality of conductive microstructures to induce electromechanical adhesion between the plurality of conductive microstructures and the surface of the object, the method can further include determining forces applied by the object against the conductive adhesive device at a plurality of surface locations on the object, determining a surface topology of the object based on the applied forces determined at the plurality of surface locations, and positioning the controllable adhesive device relative to the object at one of the plurality of surface locations selected based on the determined surface topology of the object. The positioning can occur prior to applying voltage to the plurality of conductive microstructures to induce electromechanical adhesion between the plurality of conductive microstructures and the surface of the object.

In some embodiments, each of the plurality of conductive microstructures can include one or more of a plurality of conductive fibers, conductive nanowires, conductive nanorods, and/or conductive nanotubes. At least some conductive microstructures of the plurality of conductive microstructures can be slanted and/or curved with respect to a top surface of the substrate. In some such embodiments, one or more of the slanted and/or curved conductive microstructures can be slanted and/or curved with respect to the top surface of the substrate in a substantially identical direction for anisotropic lateral adhesion. Alternatively, or additionally, one or more of the slanted and/or curved conductive microstructures can be slanted and/or curved with respect to the top surface of the substrate in different directions for isotropic lateral adhesion.

The plurality of conductive microstructures can be disposed on the substrate in a plurality of groups of conductive microstructures. Each group can include one or more conductive microstructures of the plurality of conductive microstructures. In some such embodiments, the method can include applying voltage to the plurality of conductive microstructures to induce electromechanical adhesion between the plurality of conductive microstructures and the surface of the object, and controlling the voltage applied to selectively electromechanically adhere one or more groups of conductive microstructures of the plurality of groups of conductive microstructures to the surface of the object. The method can further include determining the voltage to apply to the one or more groups of conductive microstructures of the plurality of groups of conductive microstructures based on a force applied by the surface of the object against the conductive microstructures in that group. The force applied by the surface of the object against the one or more groups of conductive microstructures of the plurality of groups of conductive microstructures can be determined based on a capacitance and/or a resistance that changes in response to deformation of the conductive microstructures in that group.

One exemplary robotic gripping system includes a plurality of movable gripping mechanisms, a plurality of controllable adhesive devices, and a controller. Each adhesive device of the plurality of controllable adhesive devices is disposed on a surface of a respective one of the plurality of movable gripping mechanisms. The adhesive devices include a substrate, a plurality of three-dimensional (3D) conductive microstructures disposed on the substrate, a dielectric coating disposed on a surface of the plurality of conductive microstructures, and a plurality of electrodes disposed on the substrate. Each of the plurality of electrodes is electrically coupled to at least one of the plurality of conductive microstructures. The 3D conductive microstructures are configured to deform when in contact with a surface of an object. The controller is coupled to the plurality of controllable adhesive devices, and is configured to direct application of voltage to the plurality of conductive microstructures through the plurality of electrodes of the adhesive device to induce electromechanical adhesion of at least one of the plurality of controllable adhesive devices to a surface of an object.

The controller can be further configured to direct application of the voltage to the plurality of conductive microstructures based on a force applied by a surface of an object against the plurality of conductive microstructures. In some such embodiments, the controller can be still further configured to determine the force applied by a surface of an object against the plurality of conductive microstructures, with the force being determined based on a change in an electrical property of one or more of the plurality of conductive microstructures for that adhesive device.

In some embodiments, the controller can be configured to direct application of the voltage to the plurality of conductive microstructures based on a surface topology of the object. In such embodiments, the controller can be further configured to position at least one of the plurality of controllable adhesive devices relative to the object at one of the plurality of surface locations selected based on the surface topology of the object prior to directing the application of voltage to the plurality of conductive microstructures through the plurality of electrodes of the adhesive device to induce electromechanical adhesion of at least one of the plurality of controllable adhesive devices to a surface of an object. The controller can be further configured to direct application of the voltage to the plurality of conductive microstructures based on a force applied by a surface of an object against the plurality of conductive microstructures. Further, the controller can also be configured to determine the surface topology of the object based on the applied forces determined at the plurality of surface locations.

The recitations provided above, and elsewhere herein, pertaining to deices, 3D conductive microstructures, and electrodes, among other components, can also be incorporated with the described one exemplary embodiment of a robotic gripping system.

BRIEF DESCRIPTION OF THE DRAWINGS

The accompanying drawings, which are incorporated herein and constitute part of this specification, illustrate exemplary embodiments, and together with the general description given above and the detailed description given below, serve to explain the features of the various embodiments:

FIG. 5A is a schematic partial side view of a 3D electromechanical adhesive device that illustrates force sensing using capacitance;

FIG. 5B is a circuit diagram that illustrates force sensing using capacitance;

DETAILED DESCRIPTION

Figure 1A:
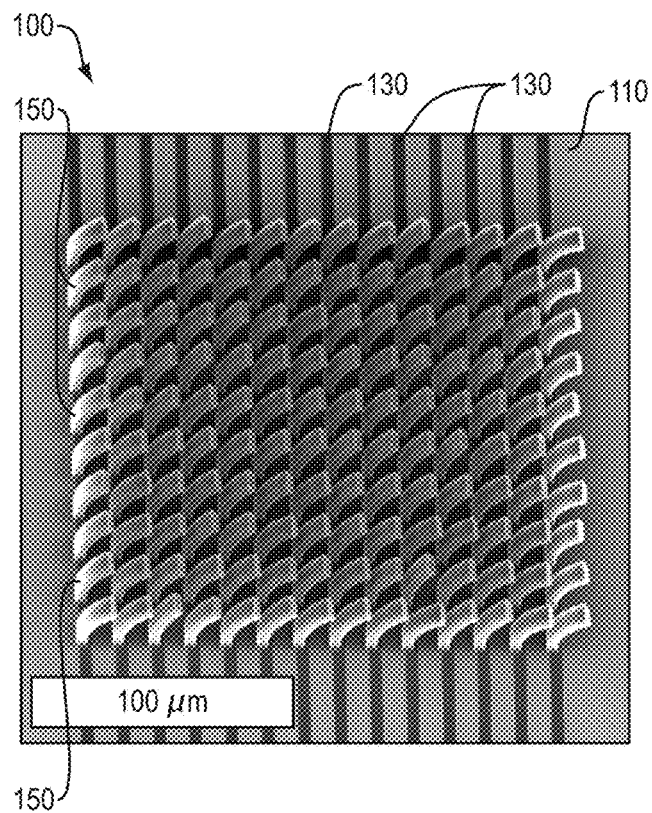
FIG. 1A illustrates a perspective view of one exemplary embodiment of a three-dimensional (3D) electromechanical adhesive device having a plurality of curved dielectrically-coated microstructures.

Certain exemplary embodiments will now be described to provide an overall understanding of the principles of the structure, function, manufacture, and use of the systems, devices, and methods disclosed herein. One or more examples of these embodiments are illustrated in the accompanying drawings. Those skilled in the art will understand that the systems, devices, and methods specifically described herein and illustrated in the accompanying drawings are non-limiting exemplary embodiments and that the scope of the present disclosure is defined solely by the claims. The features illustrated or described in connection with one exemplary embodiment may be combined with the features of other embodiments. Such modifications and variations are intended to be included within the scope of the present disclosure. In the present disclosure, like-numbered components of various embodiments generally have similar features when those components are of a similar nature and/or serve a similar purpose. A person skilled in the art, in view of the present disclosure, will understand various instances in which like-numbered components across various figures are akin.

The present disclosure describes various embodiments of controllable electromechanical adhesive devices having three-dimensional (3D) hierarchical microarchitectures. The disclosed adhesive devices can include dielectrically-coated 3D microstructures that are mechanically compliant (e.g., bendable and/or deformable). The disclosed microstructures can be controlled to provide switchable or tunable electromechanical surface adhesion, e.g., for dexterous gripping of microscale and/or macroscale objects. For example, in some embodiments, the device can be configured to tune the surface adhesion strength of one or more of the conductive microstructures without complex mechanical actuation in a wide range of adhesion on/off ratios with low operation voltage. Alternatively, or additionally, the disclosed electromechanical adhesive devices can be configured as a force sensor capable of providing tactile feedback that can be processed to determine the shear/normal forces applied against the microstructures by the surface of an object. For example, the devices can provide output indicative of changes in an electrical property of one or more microstructures for determining the applied force of an object. In some embodiments, the devices can be pixelated or otherwise configured to provide localized force sensing and/or surface adhesion.

Related systems and methods for controlling the disclosed electromechanical adhesive devices are also described. In some embodiments, a controller or control unit can be configured to process the output of one or more of electromechanical adhesive devices for determining the forces applied by the object and respectively tuning the adhesion strength of the device(s) based on the determined forces. Alternatively, or additionally, a controller or control unit can be configured to process the output of one or more electromechanical adhesive devices to determine the surface topology of an object. In some embodiments, the determined surface topology of a target object can be useful for locating a desirable surface location to position and/or orient the one or more electromechanical adhesion devices prior to gripping.

The disclosed electromechanical adhesive devices can be useful for providing tunable electromechanical surface adhesion and/or tactile force sensing in a variety of applications, including without limitation automated materials handling systems, prosthetic hands, and other robotic systems for dexterous gripping of objects. The disclosed adhesive devices can also be used or adapted for use in hanging wall-mounted televisions, picture frames, and the like. A person skilled in the art, in view of the present disclosures, will recognize other uses with which the present teachings can be used to provide gripping, adhesion, and/or holding.

Figure 1B:
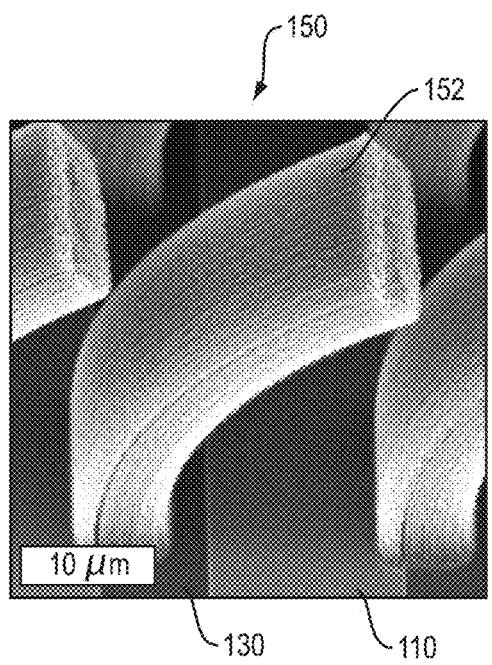
FIG. 1B illustrates a detailed perspective side view of one of the plurality of curved dielectrically-coated microstructures of FIG. 1A.
Figure 1C:
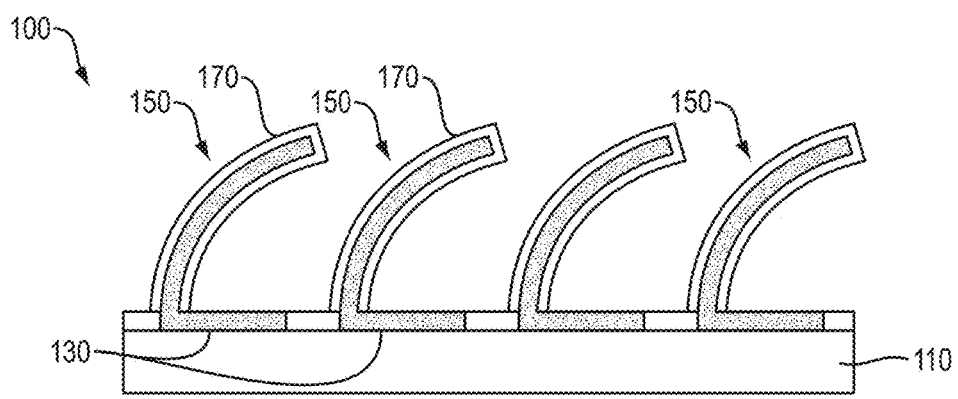
FIG. 1C is a schematic partial side view of the 3D electromechanical adhesive device of FIG. 1A.

FIGS. 1A-1C are illustrations of one exemplary embodiment of an electromechanical adhesive device 100. The device 100 has a hierarchical 3D microarchitecture device that can be controlled to electromechanically adhere to the surface of objects having varying shapes and weights. As shown, the device 100 can include a substrate 110, one or more two-dimensional (2D) electrodes 130, one or more 3D electrically conductive microstructures 150, and a dielectric coating layer 170. As discussed in more detail below, the 2D electrodes 130 and the 3D microstructures 150 can be disposed on a top surface of the substrate 110 such that each electrode can be electrically coupled to at least one of the microstructures. The dielectric coating layer 170 can be disposed at least on an outer surface of the conductive microstructures 150.

In some embodiments, the substrate 110 can be rigid to provide a fixed base for supporting the mechanically compliant microstructures 150. In an alternative embodiment, the substrate 110 can be flexible (e.g., bendable or deformable) to conform to objects having irregular or non-planar shapes. The substrate can be made of silicon, ceramic, polymer, or any other material and/or composite material. For example, the substrate can be a silicon substrate coated with a layer of silicon dioxide ($SiO_2$).

The electrodes 130 can be disposed on the top of the substrate 110 and electrically coupled to the respective bases of the conductive microstructures 150. Each of the electrodes 130 can be electrically coupled to one or more of the conductive microstructures 150. In the illustrated embodiment of FIG. 1A, the electrodes 130 are linear and aligned in parallel. However, the electrodes 130 can be arranged on the substrate 110 in other patterns. For example, as discussed in more detail at least with respect to FIG. 7, the electrodes 130 can be arranged for electrically coupling to localized groups of one or more conductive microstructures 150, sometimes referred to herein as pixels.

Voltage can be applied to the conductive microstructures 150 for inducing electromechanical adhesion through the electrodes 130. For example, as discussed in more detail at least with respect to FIGS. 3A-3C, the voltage applied through adjacent electrodes can alternate between positive and negative polarities. In some embodiments, identical voltages can be applied through the electrodes 130 for inducing electromechanical adhesion. Further, as discussed in more detail at least with respect to FIG. 7, voltage can be selectively applied to individual groups or pixels of the conductive microstructures 150 for localized electromechanical surface adhesion.

In some embodiments, the electrodes 130 can be used to provide output for sensing or determining the direction and/or magnitude of forces applied by the surface of an object against the conductive microstructures (e.g., shear and/or normal forces). For example, as discussed in more detail below at least with respect to FIGS. 5A and 5B, changes in current flow measured between adjacent or interdigitating electrodes can be used to sense corresponding changes in capacitance between adjacent microstructures that are deformed by the applied forces of the surface of an object. Alternatively, or additionally, as discussed in more detail below at least with respect to FIGS. 6A and 6B, changes in current flow measured between adjacent or interdigitating electrodes can be used to sense corresponding changes in resistance of one or more microstructures deformed by the forces applied the surface of an object. The electrodes 130 can include a variety of appropriate conductive materials, such as titanium nitride, iron, silver, and gold, among others.

As shown in the illustrated embodiment of FIG. 1A, the 3D conductive microstructures 150 can disposed on the substrate 110 to form a regular pattern, such as a rectangular two-dimensional (2D) matrix. In some embodiments, the conductive microstructures 150 can be disposed on the substrate 110 to form an irregular pattern. For example, a target object may have ridges or other surface topological features that can be used to manipulate the object. In such instances, the conductive microstructures 150 can be arranged to form an irregular pattern that corresponds to the surface topology of the object to manipulate the object.

The conductive microstructures 150 can be mechanically compliant (e.g., bendable and/or deformable) such that conformal contact can be made between at least a top section of the conductive microstructures 150 and a surface of an object. The top section can include, for example, the top 50% or less of a corresponding conductive microstructure 130. The conformal contact can increase the contact area between the device 100 and the surface of the object, thereby increasing the adhesion arising from the electrostatic force. In some embodiments, the modulus of the conductive microstructures 150 can be approximately in the range of about 2 MPa to about 200 MPa under compression.

As shown in the illustrated embodiment, at least some, if not all, of the conductive microstructures 150 can be curved and/or slanted with respect to the top surface of the substrate 110. When in contact with a surface of an object, the curved and/or slanted microstructures 150 can bend or otherwise deform to conform substantially to the surface of the object and thereby increase a contact area therebetween. In some embodiments, the microstructures 150 can be curved with a radius of curvature approximately in the range of about 10 microns to about 10 millimeters. Alternatively, or additionally, some of the microstructures can be slanted with respect to the top surface of the substrate. In some embodiments, the microstructures 150 can be slanted with respect to the surface of the substrate at an angle approximately in the range of about 0 degrees to about 90 degrees.

The directionality of the slanted or curved microstructures 150 can affect lateral adhesion, e.g., shear adhesion, along directions approximately parallel to the substrate 110. The direction of the slanted or curved microstructures 150 can be identical or locally different. For example, the microstructures can be slanted or curved in a substantially identical direction for anisotropic lateral adhesion. Alternatively, or additionally, some of the microstructures 150 can be slanted or curved in different directions for isotropic lateral adhesion. For example, the microstructures 150 can be slanted or curved in random directions, or balanced in different lateral directions (e.g., anywhere between 3 to 12 different lateral directions). In some embodiments, the microstructures 150 can be configured to extend approximately vertically straight from the top surface of the substrate 110. The normal and lateral adhesions can be substantially identical for vertically straight microstructures.

The conductive microstructures 150 can be porous. In some embodiments, the conductive microstructures 150 can be characterized by the size of the pores (also referred to as the pore size). The pore size can be measured as the average distance between adjacent microstructures 150. Alternatively, the pore size can be measured as the average void size or diameter within the dielectric-coated microstructures 150. Depending on the implementation, the pore size can be approximately in the range of about 10 nanometers to about 10 microns. In some embodiments, the pore size be less than about 10 nanometers. The porosity (also referred to as the void fraction) within the conductive microstructures 150 can be approximately in the range of about 10% of the microstructure volume to about 99% of the microstructure volume. The dielectric coating layer 170 usually decreases the porosity of a nanoporous microstructure. In some embodiments, the above porosities can be achieved after taking into account the dielectric coating layer 170.

The conductive microstructures 150 can include various types of media and structures to achieve a desired porosity and/or mechanical compliance. In some embodiments, the conductive microstructures 150 can be composed of nano-sized conductive fibers, such as nanowires, nanorods, nanotubes, or filaments. For example, in some embodiments, multiple conductive carbon nanotubes 152 can be provided, sometimes referred to herein as a forest of carbon nanotubes 152. The carbon nanotubes 152 can include single-walled and/or multi-walled carbon nanotubes.

In some embodiments, the height (or length) of the nanotubes 152 can be approximately in the range of about 200 nanometers to about 1 millimeter. In some embodiments, the nanotubes 152 can have approximately the same height. Alternatively, the nanotubes 152 can be fabricated to have a height variance. For example, a height variance amongst a plurality of nanotubes can be approximately in the range of about 10 nanometers to about 100 microns. Variance in the respective nanotube heights can create roughness at the free ends of the conductive microstructures 150, such that the surface of an object can be more conformally secured. In some examples, the height variance of the nanotubes 152 can be approximately in the range of about 1% of the average height of the nanotubes to about 20% of the average height of the nanotubes.

Further, in some embodiments, the carbon nanotubes 152 of the conductive microstructures 150 can have a diameter approximately in the range of about 1 nanometer to about 100 nanometers. The microstructures 150 can have a width approximately in the range of about 1 micron to about 1000 microns. In some embodiments, the microstructures 150 can have a high aspect ratio (i.e., height-to-width ratio) that can be approximately in the range of about 5 to about 100. In some embodiments, the height-to-width ratio can be greater than about 100. In some embodiments, the microstructures can have a thickness approximately in the range of about 0.5 microns to about 500 microns.

In some alternative embodiments, the conductive microstructures 150 can be made of a nanocarbon foam, a cast aerogel, and/or a 3D-printed nanoporous stamp using photopolymerization. In yet other alternative embodiments, the conductive microstructures 150 can be made by casting a film of micrometer or nanometer sized particles, compacting them to create at least a partially fused or sintered assembly having nanopores defined between them.

The dielectric coating layer 170 can be conformally disposed on an outer surface of the conductive microstructures 150. The dielectric layer 170 can also be disposed on the top surface of the substrate 110. The dielectric layer 170 can have a thickness approximately in the range of about 0.1 nanometers to about 50 nanometers. Various materials can be used for the dielectric layer 170. In some embodiments, the dielectric layer 170 can include a ceramic, such as aluminum oxide ($Al_2O_3$). Alternatively, or additionally, the dielectric layer 170 can include a polymer, such as without limitation, fluoropolymer, polyacrylate, polyfluoroacrylate, polyperfluorodecylacrylate, polydimethylsiloxane (PDMS), polymethyl methacrylate (PMMA), dimethylaminomethyl-styrene (DMAMS), 2-hydroxy ethyl methacrylate (HEMA), l-vinyl-2-pyrrolidone (VP), ethylene glycol diacrylate (EGDA), trivinyltrimethylcyclotrisiloxane (V3D3), methacrylic acid (MAA), ethlacrylate, glycidyl methacrylate (GMA), and/or polyperfluorodecylacrylate (PFDA).

Figure 2A:
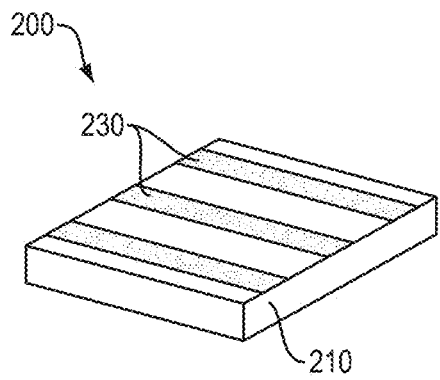
FIGS. 2A-2D are schematic illustrations of one exemplary method of fabricating an a 3D electromechanical adhesive device, similar to the device of FIG. 1A.

FIGS. 2A-2D are schematic illustrations of one exemplary method of fabricating a three-dimensional (3D) electromechanical adhesive device 200, like the device 100 of FIG. 1A. As shown in FIG. 2A, a conductive layer of one or more electrodes 230 can be deposited or otherwise formed on the substrate 210 via, for example, chemical vapor deposition (CVD) or physical vapor deposition (PVD). The substrate 210 can include a silicon base coated with about 300 nanometers of thermally grown silicon dioxide ($SiO_2$).

The electrodes 230 can include any appropriate conductive material, such as titanium nitride (TiN). The electrodes 230 can have a thickness approximately in the range of about 20 nanometers to about 150 nanometers, or even greater if desired.

Figure 2B:
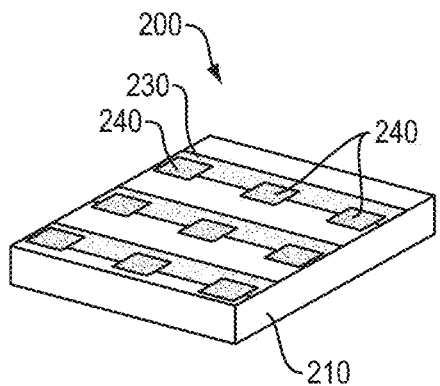

As shown in FIG. 2B, a layer of one or more catalyst films 240 can be deposited at least partially on each of the electrodes 130. The catalyst films 240 can include a first sublayer of iron (Fe) disposed on a second sublayer of aluminum oxide ($Al_2O_3$), both of which can be deposited by electron beam physical vapor deposition. The thickness of the Fe sublayer can be about 1 nanometer and the thickness of the $Al_2O_3$ sublayer can be about 10 nanometers, for example. In some examples, the layer of catalyst films 240 can be patterned via, for example, lithography. The pattern of the catalyst layer 240 can be substantially similar to the desired pattern of the carbon nanotubes (CNTs) and/or metal nanowires to be grown on the catalyst. For example, the catalyst layer 240 can include a periodic 2D array. The pitch of the array can be approximately in the range of about 1 micron to about 100 microns.

Figure 2C:
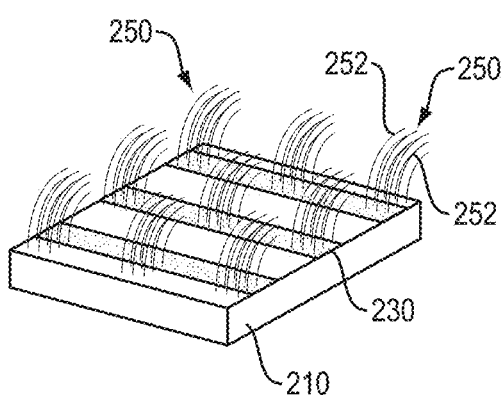

As shown in FIG. 2C, conductive microstructures 250 can be formed on each of the electrodes 230. In the illustrated embodiment, each of the microstructures 250 includes a forest of carbon nanotubes 252. The nanotubes 252 can be grown on a respective catalyst film 240, for example, using a chemical vapor deposition (CVD) process. The width and thickness microstructures 150 can be controlled, at least in part, by the pattern of the underlying catalyst films 240. For example, the microstructures 250 can have a width approximately in the range of about 1 micron to about 1 millimeter, and a thickness approximately in the range of about 0.5 microns to about 500 microns. The height (or length) of the microstructures 250 can be controlled, at least in part, by the growth time and/or the growth rate of the CVD process. The growth time can be approximately in the range of about 10 microns per minute to about 200 microns per minute. The radius of curvature of the conductive microstructures 250 can be controlled, at least in part, by the growth temperature (e.g., approximately in the range of about 750 degrees Celsius to about 800 degrees Celsius), and by the overlap and thickness of the layers beneath the catalyst patterns. In some embodiments, conductive microstructures 250 can be transferred onto the electrodes 230 after being grown on another substrate (not shown).

Figure 2D:
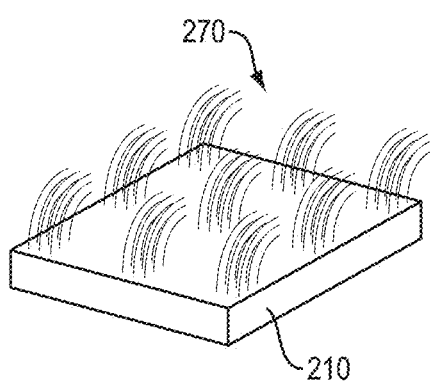

As shown in FIG. 2D, a dielectric layer 270 can be conformally coated on the microstructures 250, including the outer surfaces of the side walls of the carbon nanotubes 252. The dielectric layer 270 can be deposited using an atomic layer deposition (ALD) process or a chemical vapor deposition (CVD) process.

Additional details suitable for fabricating the 3D electromechanical adhesive device 200, like the device 100 of FIG. 1A described herein, are described in International Patent Application No. PCT/US2018/012510, filed on Jan. 5, 2018, the entire contents of which are incorporated herein by reference.

Figure 3A:
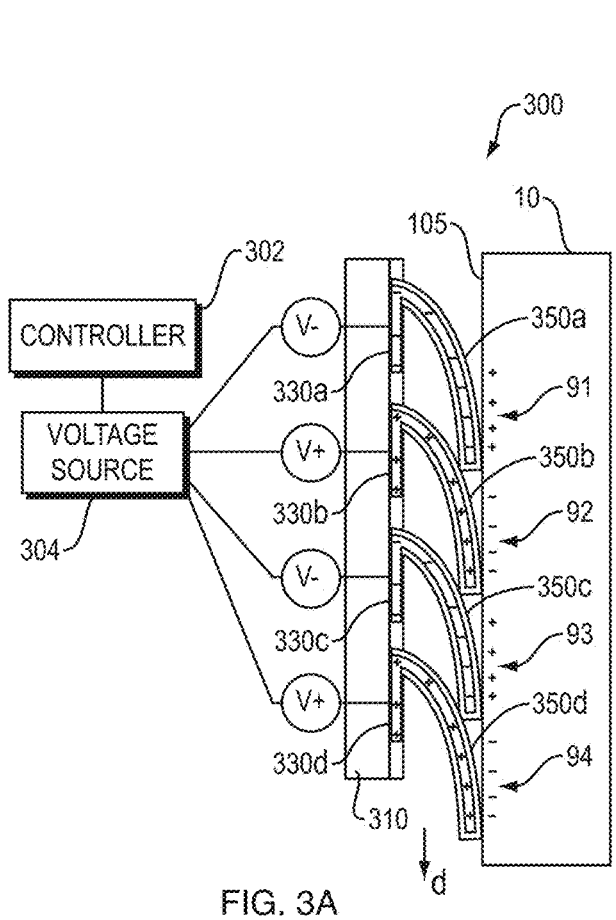
FIG. 3A is a schematic partial side view of a 3D electromechanical adhesive device inducing electromechanical adhesion.
Figure 3B:
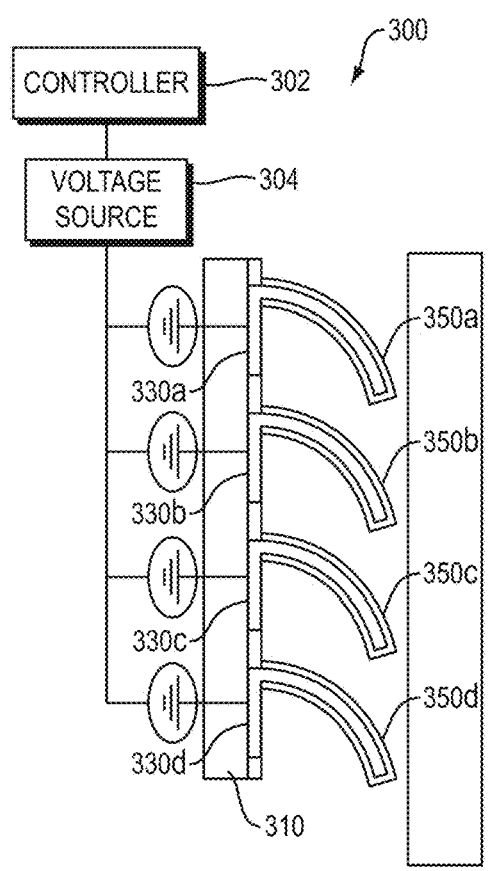
FIG. 3B is a schematic partial side view of a 3D electromechanical adhesive device releasing electromechanical adhesion.
Figure 3C:
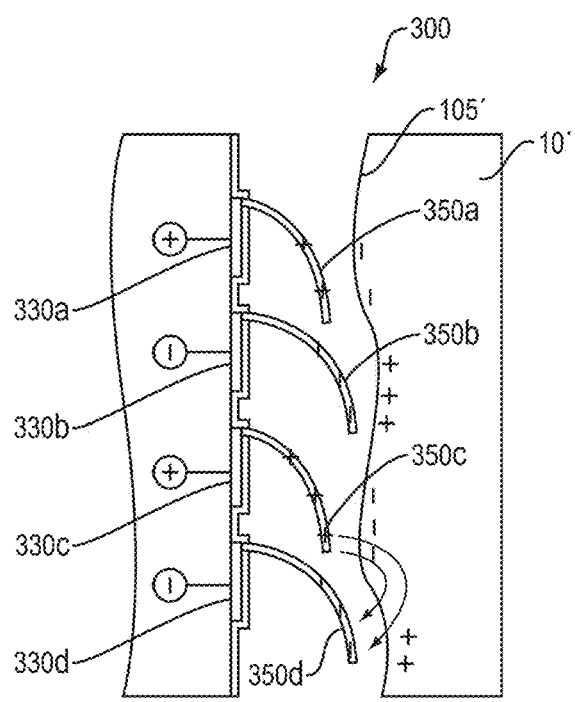
FIG. 3C is a schematic partial side view of a 3D electromechanical adhesive device inducing electromechanical adhesion with a non-planar object.

FIGS. 3A-3C are schematic illustrations of one exemplary method of an electromechanical adhesive device 300 for electromechanically adhering to surface of an object. In the illustrated embodiment, the device 300 includes an array of dielectrically-coated conductive microstructures 350a, 350b, 350c, and 350d (collectively 350) electrically coupled to electrodes 330a, 330b, 330c, 330d (collectively electrodes 330) disposed on a substrate 310.

Except as described below or as will be readily appreciated by one having skill in the art, the electromechanical adhesive device 300 is substantially similar to the electromechanical adhesive devices 100 and 200 described above. A detailed description of the structure and function thereof is thus omitted here for the sake of brevity. The electromechanical adhesive device 300 can include any one or more of the features of the electromechanical adhesive device 100 and 200 described above.

Each electrode 330 can be electrically coupled to a voltage source 304 (e.g., a power supply) and the voltage source can be further coupled to a controller or control unit 302. The controller 302 can be configured to set the voltages that are applied to the dielectrically-coated microstructures 350 by the voltage source 304 through the electrodes 330. In some embodiments, the controller 302 and the voltage source 304 can be a component of the adhesive device 300. Alternatively, one or more of the controller 302 and the voltage source 304 can be a remotely connected to the device 300. For example, the controller 302 may be part of another pre-existing device (e.g., a computer), or it may be a standalone component.

As shown in FIG. 3A, the device 300 and the object 10 can be brought into close contact with one another such that the dielectrically-coated microstructures 350 presses against a surface 10s of the object 10. As the device 300 and the object 10 continue to be pressed together, the dielectrically-coated microstructures 350 can bend or deform, thereby increasing the contact area between the microstructures and the surface 10s of the object 10. For example, the respective contact areas $a_1$, $a_2$, $a_3$, and $a_4$ between the curved microstructures 350 and the surface 10s of the object 10 can increase as the microstructures bend towards direction d. The mechanical adhesion strength due to van der Waals forces depends, at least in part, on the size of the contact area.

To induce an additional electrostatic attraction between the dielectrically-coated microstructures 350 and the surface 10s of the object 10, a voltage can be applied to each of the microstructures through a corresponding electrode 330. In some embodiments, the applied voltage can alternate between voltages having positive and negative polarities for adjacent microstructures. For example, as shown in FIG. 3A, a negative voltage (V−) can be applied to the microstructures 350a and 350c, and a positive voltage (V+) can be applied to the adjacent microstructures 350b and 350d. In some embodiments, the voltage applied to adjacent microstructures can be identical (e.g., V+ or V−). For example, where the object 10 is conductive, a positive voltage (V+) can be applied to the microstructures 350 and a negative voltage (V−) or ground can be applied to the object.

Electrical charges do not freely move between the dielectrically-coated microstructures 350 and the surface of the object 10. Instead, when positive and negative charges are induced on adjacent microstructures as described above, an electric field forms between the microstructures. The formed electric field induces electrical charges having opposite polarities to accumulate along the surface 10s of the object 10. The induced charges on the dielectrically-coated microstructures 350 and the surface 10s of the object 10 can create an electrostatic force that pulls these opposing surfaces together. This principle applies to both conductive and non-conductive objects. As the microstructures 350 and the surface 10s of the object 10 pull together, the mechanically compliant microstructures can continue to bend and/or deform such that they substantially conform to the surface 10s of the object, thereby further increasing the mechanical contact area therebetween.

Figure 4A:
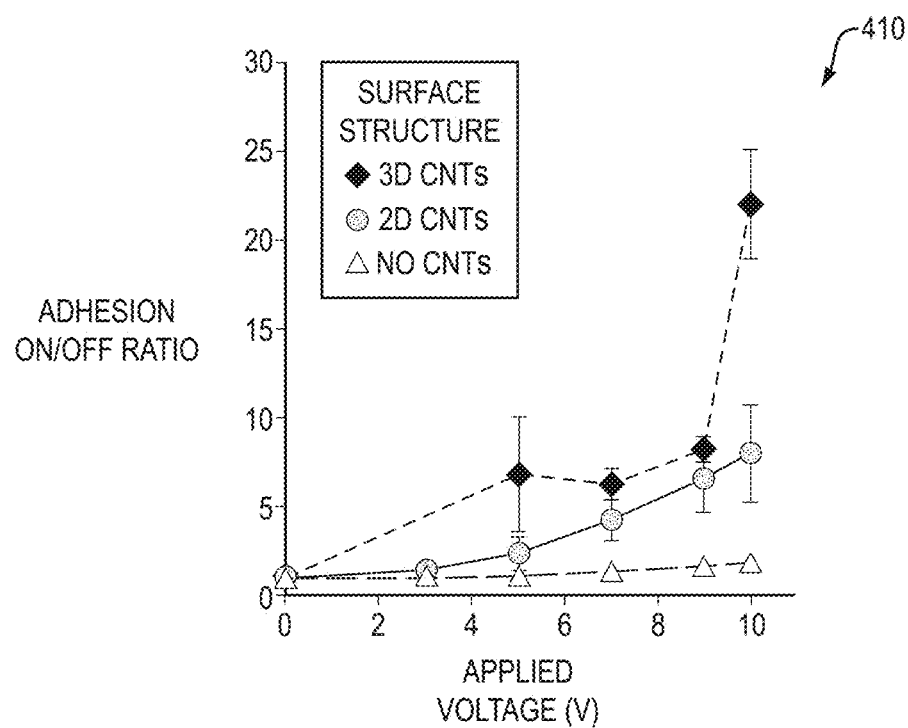
FIG. 4A is a graph that illustrates an adhesion on/off ratio for a 3D electromechanical adhesive device, similar to the device of FIG. 1A, for a range of applied voltages.
Figure 4B:
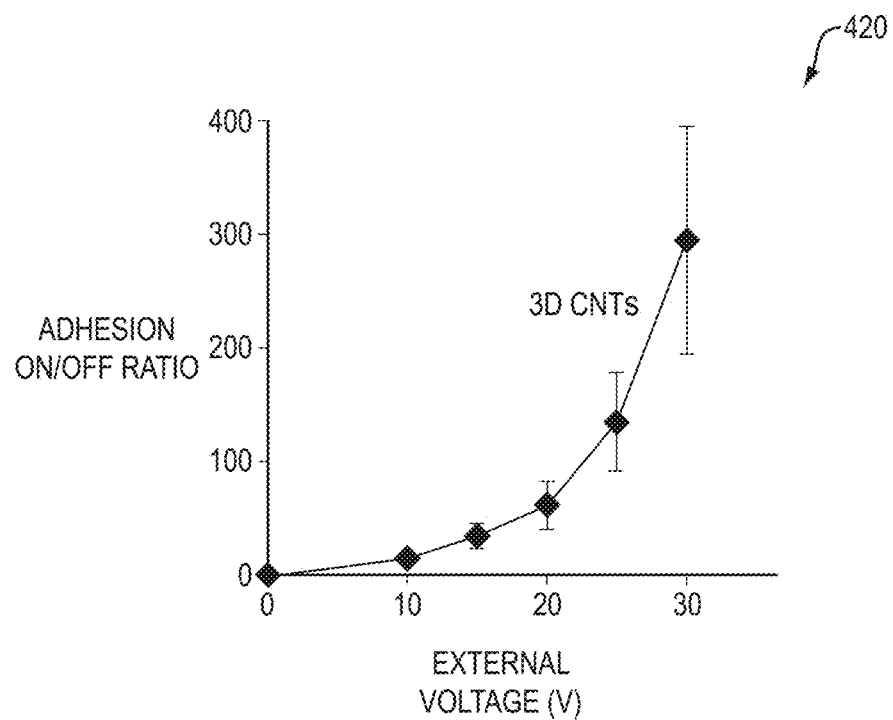
FIG. 4B is a graph that illustrates an adhesion on/off ratio for a 3D electromechanical adhesive device, similar to the device of FIG. 1A, for a further range of applied voltages.

Accordingly, the mechanical compliance of the 3D microstructures can facilitate increased electromechanical adhesion strength at lower applied voltages. For example, graph 410 of FIG. 4A compares the adhesion on/off ratio of a 3D electromechanical adhesive device, like device 300, having 3D carbon nanotube microstructures (i.e., 3D CNTs) against conventional planar electromechanical adhesion devices (i.e., 2D CNTs and No CNTs) over a range of applied voltages. Adhesion on/off ratio is a relative comparison of the adhesive strength (e.g., in Newtons) of an electromechanical adhesive device with and without an applied voltage. As shown, in the graph 410, a 3D electromechanical adhesive device, like device 300, can have an adhesive on/off ratio approximately in the range of about 20 to about 25 at an applied voltage of about 10 volts, which is about 5 times greater than conventional 2D electromechanical adhesion devices. The graph 420 of FIG. 4B further illustrates that the adhesion on/off ratio of a 3D electromechanical adhesive device, like device 300, can have an adhesive on/off ratio approximately in the range of about 200 to about 400 (e.g., about 300) at an applied voltage (referred to in the figure as "external voltage") of about 30 volts.

As shown in FIG. 3B, the dielectrically-coated microstructures 350 can be configured to switch off the electrostatic attraction and release the object 10 by removing the voltage applied by the voltage source 304 through the electrodes 330. For example, the controller 302 can be configured to direct the voltage source 304 to electrically couple the electrodes 330 to ground. Alternatively, the controller 302 can direct the voltage source 304 to reduce the voltage applied to the electrodes 330 to a magnitude where the weight or other load force of the object is greater than the electromechanical adhesion at the reduced voltage. FIG. 3C illustrates that the mechanically compliant 3D microstructures 350 of the device 300 can electromechanically adhere and conform to a surface 10s' of an object 10' that is non-planar or otherwise irregular.

As discussed above, a controller 302 can be configured to set (or tune) the voltages and direct a voltage source 304 to apply the set voltages to the dielectrically-coated microstructures 350 through the electrodes 330 for electromechanical adhesion. In some embodiments, the voltage(s) can be set to predetermined voltages based on known parameters of a target object for a particular application, such as an applied load, However, in some applications, the particular object and expected loads may not be entirely known in advance. Accordingly, in some embodiments, it can be useful to configure the 3D electromechanical adhesive device to operate as a force sensor.

For example, as discussed in more detail at least with respect to FIGS. 5A-6B below, a 3D electromechanical adhesive device can be configured to provide tactile feedback or output that can be processed by a controller to determine the shear/normal forces applied against the microstructures by the surface of an object. The controller can use the determined force information to perform tasks such as detect whether the device is touching an object to be picked up, determine a surface topology of the object, e.g., for selecting a desirable surface location to grip, and/or to set the appropriate voltages for tuning the adhesive strength of the device.

For example, FIGS. 5A and 5B are schematic illustrations of one exemplary embodiment of an electromechanical adhesive device 500 configured for force sensing. In the illustrated embodiment, the device 500 can include an array of dielectrically-coated conductive microstructures 550a, 550b, 550c, and 550d (collectively 550) electrically coupled to electrodes 530a, 530b, 530c, 530d (collectively electrodes 530) disposed on a substrate 510. Each electrode 530 can be electrically coupled to a voltage source 504 (e.g., a power supply) and the voltage source can be further coupled to a controller or control unit 502.

Except as described below, or as will be readily appreciated by one having skill in the art, the electromechanical adhesive device 500 is substantially similar to the electromechanical adhesive devices 100, 200, and 300 described above. A detailed description of the structure and function thereof is thus omitted here for the sake of brevity. The electromechanical adhesive device 500 can include any one or more of the features of the electromechanical adhesive device 100, 200, and 300 described above.

As shown in FIG. 5A, each electrode 530 can be electrically coupled to at least one of the dielectrically coated microstructures 550 and each microstructures can be composed of multiple conductive fibers or nanotubes 552 (e.g., carbon nanotubes) coated by a dielectric layer 570. Accordingly, when the device 500 is not in contact with an object, the dielectrically-coated microstructures (e.g., 550a, 550b) disposed between adjacent electrodes (e.g., 530a, 530b) can have an initial capacitance $C_0$ (see FIG. 5B). However, when the microstructures 550 and the surface 10s" of an object 10" are pressed against one another, the forces applied by the surface of the object (e.g., a shear force $F_S$ and/or a normal force $F_N$) can cause the microstructures to bend and/or deform. Such deformation can cause the capacitance between adjacent electrodes (e.g., 530a, 530b) to change from the initial capacitance $C_0$ to an increased capacitance $C_f$ (see FIG. 5B). For example, deformation of a microstructure can decrease the distance or separation among its constituent dielectrically-coated fibers or nanotubes 552 and thereby cause a corresponding increase in its capacitance. Capacitance measurement can be correlated to a corresponding shear force $F_S$ and/or a normal force $F_N$ through a calibration process. For example, in some embodiments, the calibration process may involve monitoring changes in capacitance output from the device 500 in response to application of forces of known magnitude and/or direction.

Accordingly, in some embodiments, the controller 502 can be connected to adjacent electrodes (e.g., 530a, 530b) that electrically couple to adjacent microstructures (e.g., 550a, 550b). The controller 502 can be configured to measure the current through the electrodes (e.g., 530a, 530b) in response to application of a small AC voltage (e.g., a few volts). The measured current can be used to determine the capacitance C according to the formula i=C*dv/dt, i.e., where i is the measured current, and dv/dt is change in applied voltage over time. The controller 502 can use such capacitance measurements to determine, for example, the magnitude and/or direction of a force applied by the surface 10s" of an object 10" based, at least in part, on a predetermined correlation between capacitance and force.

Figure 6A:
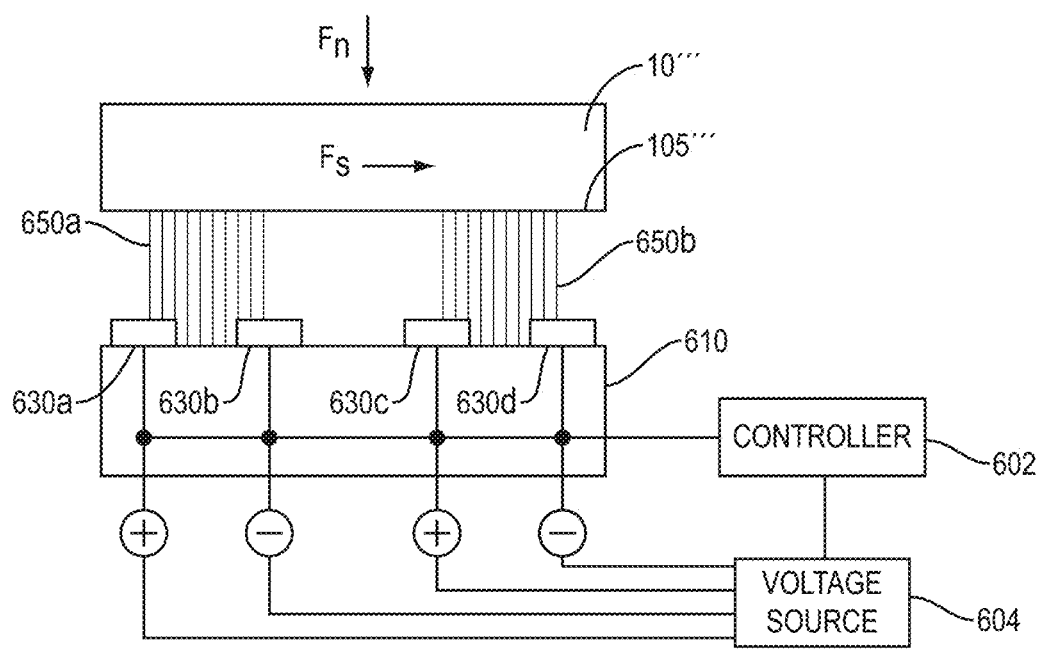
FIG. 6A is a schematic partial side view of a 3D electromechanical adhesive device that illustrates force sensing using resistance.
Figure 6B:
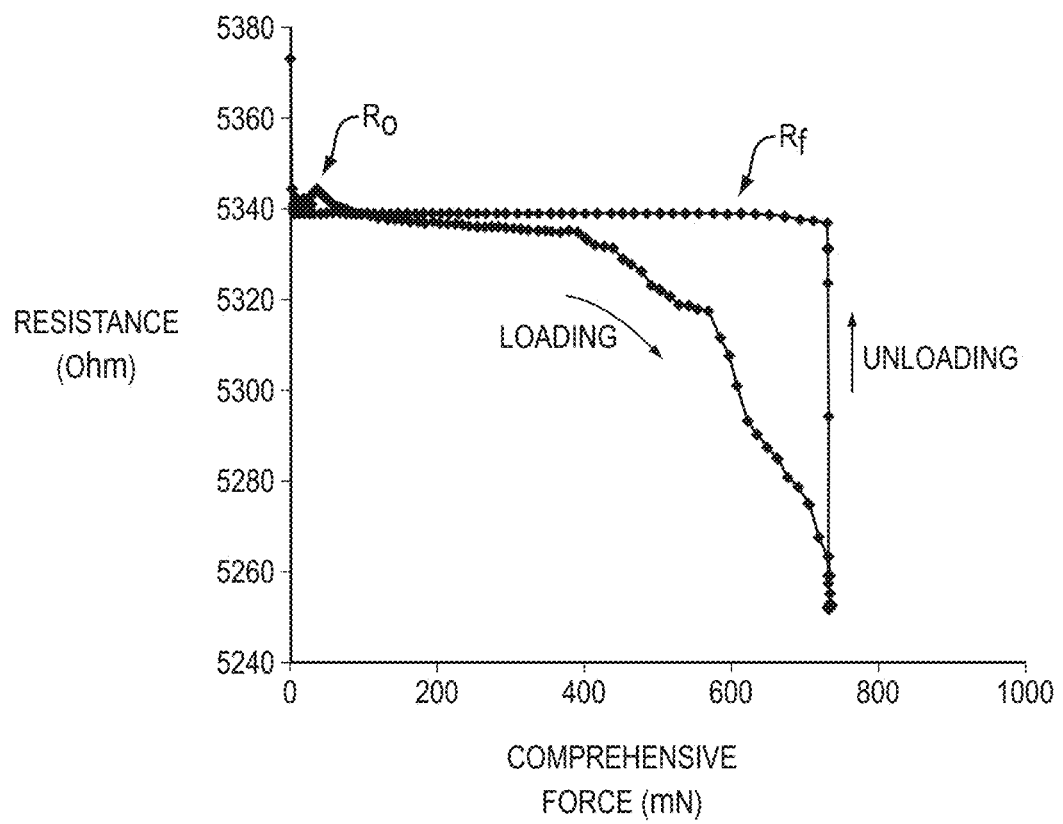
FIG. 6B is a graph that illustrates a relationship between a force and resistance in the 3D electromechanical adhesive device of FIG. 6A.

Alternatively, or additionally, in some embodiments, force sensing can be achieved by determining changes in the resistance of individual microstructures. For example, FIGS. 6A and 6B are schematic illustrations of one exemplary embodiment of an electromechanical adhesive device 600 configured for force sensing based on changes in resistance of individual microstructures. In the illustrated embodiment, the device 600 can include an array of dielectrically-coated conductive microstructures 650a and 650b (collectively 650) and electrodes 630a, 630b, 630c, 630d (collectively electrodes 630) disposed on a substrate 610. Each electrode 630 can be electrically coupled to a voltage source 604 (e.g., a power supply) and the voltage source can be further coupled to a controller or control unit 602.

Except as described below, or as will be readily appreciated by one having skill in the art, the electromechanical adhesive device 600 is substantially similar to the electromechanical adhesive device 100 described above. A detailed description of the structure and function thereof is thus omitted here for the sake of brevity. The electromechanical adhesive device 600 can include any one or more of the features of the electromechanical adhesive devices 100, 200, 300, and 500 described above.

As shown in FIG. 6A, each of the dielectrically-coated microstructures 650 can be electrically coupled across adjacent pairs of electrodes 630. Accordingly, when the device 600 is not in contact with an object, each of the dielectrically-coated microstructures 650 can have an initial or non-deformed resistance $R_0$ (see FIG. 6B). However, when the microstructures 650 and the surface 10s''' of an object 10''' are pressed against one another, the forces applied by the surface of the object (e.g., a shear force $F_S$ and/or a normal force $F_N$) can cause the microstructures to bend and/or deform. Such deformation can cause the resistance of a microstructures (e.g., 650a) across adjacent electrodes (e.g., 630a, 630b) to change from its non-deformed resistance $R_0$ to a decreased resistance $R_f$ (see FIG. 6B). For example, when the microstructure deforms due to an external load, the number of nanoscale contact points within the structure changes. As a result, the total resistance of an electrical current flowing through the microstructure, e.g., 650a, changes according to the external load (e.g., a shear force $F_S$ and/or a normal force $F_N$). For example, as the load increases, the resistance of an individual microstructure can decrease. Resistance measurements can be correlated to a corresponding shear force $F_S$ and/or a normal force $F_N$ through a calibration process. For example, in some embodiments, the calibration process may involve monitoring changes in resistance output from the device 600 in response to application of forces of known magnitude and/or direction.

Accordingly, in some embodiments, the controller 602 can be connected across adjacent electrodes (e.g., 630a, 630b) that electrically couple to one or more corresponding microstructures (e.g., 650a). The controller 602 can be configured to measure the current through the electrodes (e.g., 630a, 630b) in response to application of a small DC voltage (e.g., a few volts). The measured current can be used to determine the resistance R according to the formula V=I*R, i.e., where V is applied voltage and I is the measured current. The controller 602 can use such resistance measurements to determine, for example, the magnitude and/or direction of a force applied by the surface 10s''' of an object 10''' based on a predetermined correlation between capacitance and force.

Figure 7:
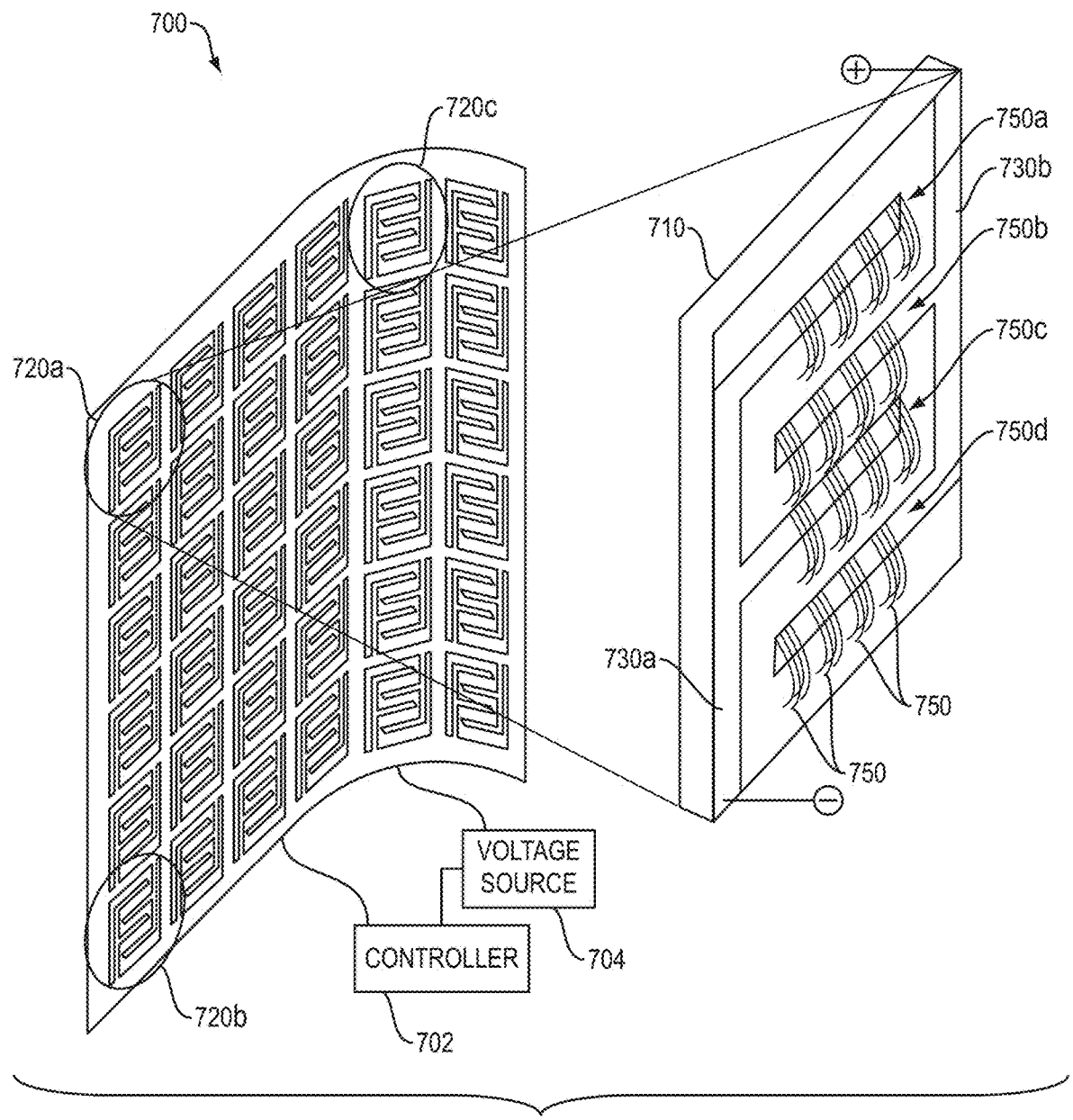
FIG. 7 is a schematic perspective view of a 3D electromechanical adhesive device configured for localized control of electromechanical surface adhesion and force sensing.

FIG. 7 is a schematic illustration of one exemplary embodiment of an electromechanical adhesive device 700 having individually controllable groups of 3D microstructures and electrodes, sometimes referred to herein as pixels 720. In the illustrated embodiment, the device 700 includes a 6×6 array of pixels 720. However, the device 700 can be configured to include an array of pixels 720 having any number of rows and columns. In some embodiment, the pixels 720 can be arranged in a pattern other than a row-by-column array. Patterned and non-patterned arrays are both possible, as is a combination of the two.

Each pixel 720 can have at least one electrode 730 electrically coupled to at least one dielectrically-coated microstructure 750 disposed on a section of the substrate 710. For example, in the illustrated embodiment, each pixel 720 includes a pair of interdigitating electrodes 730a and 730b (collectively electrodes 730) with each electrode being electrically coupled to four rows of dielectrically-coated microstructures 750a, 750b, 750c, and 750d. As shown, the interdigitating electrodes 730 can be F-shaped, such that each electrode can be electrically coupled to alternating rows of microstructures. For example, as shown, the electrode 730a can be electrically coupled to the microstructures at rows 750a and 750c and the electrode 730b can be electrically coupled to the microstructures at rows 750b and 750d. Accordingly, the electrode 730a can apply a voltage to the microstructures at rows 750a and 750c, and the electrode 730b can apply a voltage having an opposite polarity to the microstructures at rows 750b and 750d.

Each pixel can be independently coupled to one or more of a controller or control unit 702 and a voltage source 704 for localized control of electromechanical surface adhesion and/or force sensing as described above. For example, the controller 702 can be configured to direct the voltage source 704 to selectively apply the same or different voltages to the pixels 720a, 720b and 720c. Likewise, the controller 702 can be configured to sense the load (e.g., shear and/or normal forces) applied by the surface of an object at various pixel locations as described above with respect to FIGS. 5A-6B. This provides tactile feedback at high spatial resolution, which can be useful to train of robotic gripping systems using machine learning and real-time vision to grip objects with shapes, sizes, and/or weight.

Figure 8:
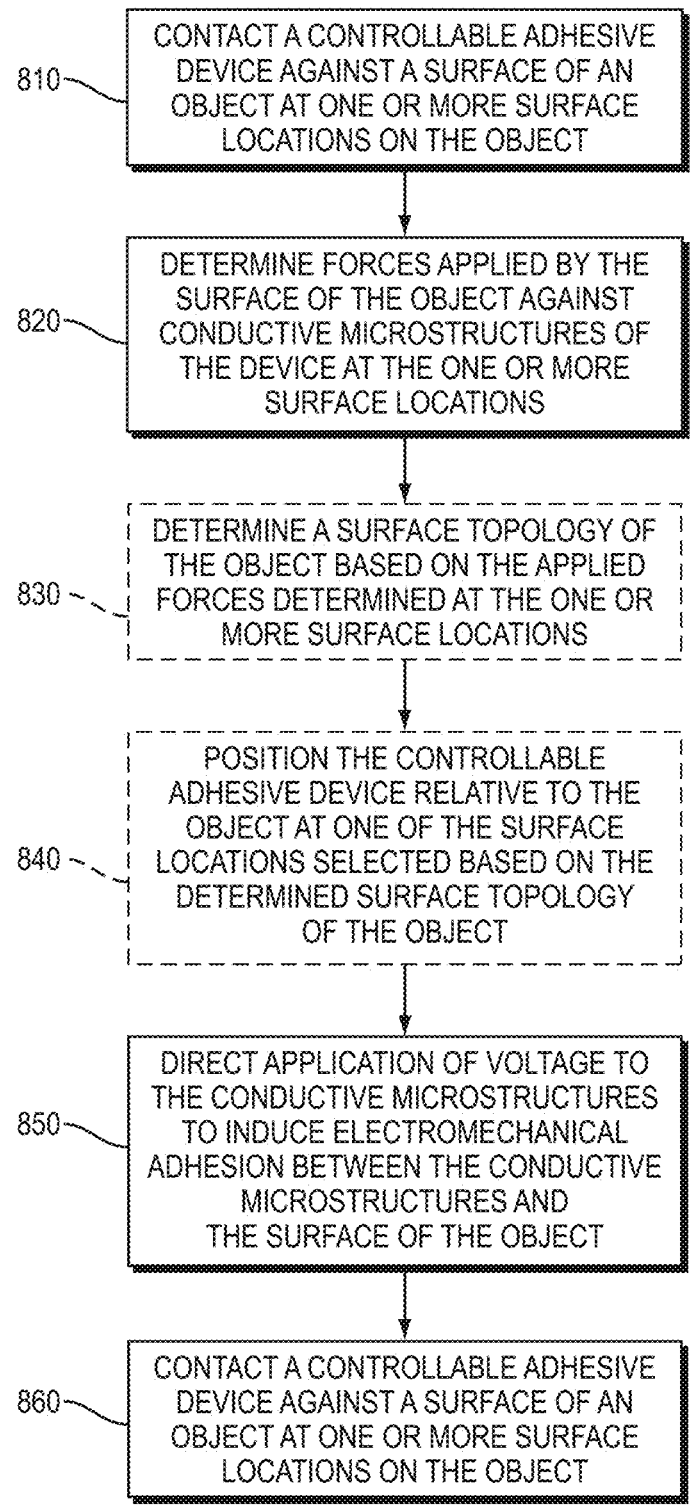
FIG. 8 illustrates one exemplary method of using a controllable adhesive device for dexterous gripping and/or otherwise manipulating an object.

As described above, the 3D electromechanical adhesive devices 100, 200, 300, 500, 600, and 700 can be useful to provide tunable electromechanical adhesion and force sensing. Accordingly, in some embodiments, it can be desirable to take advantage of such capabilities in a variety of applications. For example, FIG. 8 illustrates one exemplary of method 800 of using an controllable adhesive device for dexterous gripping and/or otherwise manipulating of an object.

At block or step 810, a controllable adhesive device (e.g., 700) can be contacted against a surface of an object. In some embodiments, the controllable adhesive device 700 can be navigated to one surface location on the object. Alternatively, the controllable adhesive device 700 can be navigated to more than one surface location on an object, e.g., sequentially. In some embodiments, the controllable adhesive device 700 can be disposed on a robotic gripping system capable of navigating the device into contact with the one or more surface locations on the object.

At block or step 820, forces applied by the surface of the object against the conductive microstructures 750 of the controllable adhesive device 700 at the one or more surface locations. In some embodiments, the controller 702 and the voltage source 704 can determine the shear and/or normal forces applied by the object against the conductive microstructures 750 of the device 700 at each surface location. For example, as discussed above with respect to FIGS. 5A-6B, the controller 702 can determine the force(s) applied by the surface of the object based on a change in an electrical property of one or more of the conductive microstructures 750. The electrical property can be, for example, a capacitance or a resistance that changes in response to deformation of one or more of the microstructures 750. As discussed above with respect to FIG. 7, in some embodiments, the controller 702 can determine the force applied by the surface of an object against one or more groups of conductive microstructures 750, e.g., at various pixel locations 720 on the substrate 710.

Optionally (as conveyed by the dotted lines), at block or step 830, a surface topology of the object can be determined based, at least in part, on the applied force determined at the one or more surface locations. As discussed above with respect to FIG. 7, the controller 702 can determine the forces applied by the surface of an object at various pixel locations on the device 700. Accordingly, in some embodiments, the magnitude and/or direction of the forces determined at each of the pixel locations can be used to generate a surface map or other representation that represents the topology or terrain for each of the surface locations.

Optionally (as conveyed by the dotted lines), at block or step 840, the controllable adhesive device 700 can be positioned or otherwise oriented relative to the object at one of the surface locations. In some embodiments, the controller 702 can direct a robotic gripper system or other navigation system to maneuver the controllable adhesive device 700 to one of the surface locations selected based on the determined surface topology of the object. For example, the controllable adhesive device 700 can be positioned relative to a selected surface location having a desired surface topology for electromechanical surface adhesion.

At block or step 850, the voltage can be directed to the dielectrically-coated conductive microstructures 750 to induce electromechanical adhesion between the microstructures and the surface of the object. For example, in some embodiments, the controller 702 can set or otherwise tune a voltage to apply to the conductive microstructures 750 to selectively apply to one or more group of microstructures (i.e., pixels 720). The controller 702 can set the voltage to be applied to the conductive microstructures 750 or respective pixels 720 based, at least in part, on applied forces determined at block 820.

At block or step 860, the applied voltage(s) can be removed or otherwise reduced to release the object. For example, as discussed above at least with respect to FIG. 3B, the controller 702 can direct the voltage source 704 to electrically couple the respective electrodes to ground or otherwise reduce applied voltage to release the object.

In some embodiments, the disclosed electromechanical adhesive devices can be useful for providing tunable electromechanical surface adhesion and/or tactile force sensing in a variety of systems.

Figure 9A:
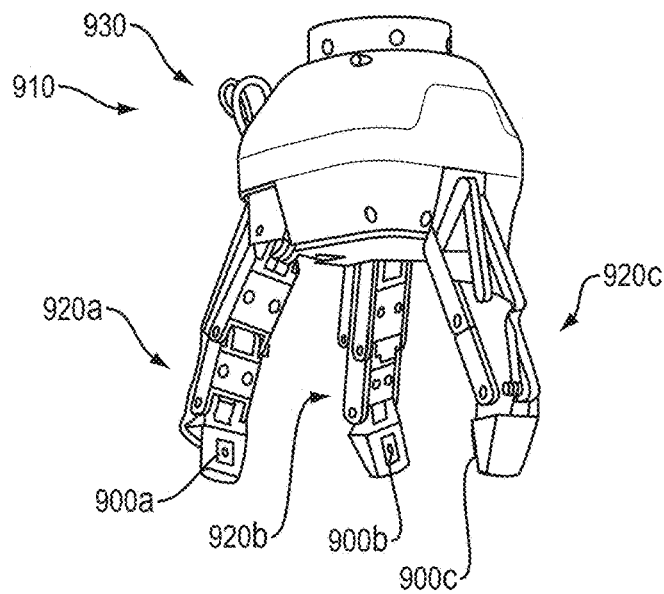
FIG. 9A is a perspective view of one exemplary embodiment of a robotic gripping system that includes 3D electromechanical adhesive devices.

For example, FIG. 9A illustrates one exemplary embodiment of a robotic gripping system 910 that includes one or more 3D electromechanical adhesive devices 900. Except as described below or as will be readily appreciated by one having skill in the art, the electromechanical adhesive device 900 is substantially similar to any of the electromechanical adhesive devices 100, 200, 300, 500, 600, and 700 described above. A detailed description of the structure and function thereof is thus omitted here for the sake of brevity. The electromechanical adhesive device 900 can include any one or more of the features of the electromechanical adhesive device 100, 200, 300, 500, 600, and/or 700 described above.

In the illustrated, the robot gripping system or gripper 910 includes three movable gripping mechanisms 920a, 920b, and 920c (collectively 920) that extend distally from a proximal base 930 of the gripper 910. In other embodiments, the gripping system 910 can include more or less than three gripping mechanisms 920. In some embodiments, each of the gripping mechanisms 920 can be a jointed, finger-type assembly that can be actuated to move in any number of directions to grasp onto one or more surface locations of an object. In some embodiments, the gripping system 910 can include multiple controllable adhesive devices 900a, 900b, and 900c (collectively 900). Each of the controllable adhesive devices 900 can be disposed on a surface of a respective one of the movable gripping mechanisms 920. For example, in the illustrated embodiment, the controllable adhesive devices 900 are disposed on an inward-facing surface at a distal end of the gripping mechanism 920. As discussed above at least with respect to FIGS. 3A-3B, 5A-5B, 6A, 6B, and 7, the controllable adhesive devices 900 can be configured to provide tunable electromechanical adhesion and/or force sensing.

The disclosed electromechanical adhesive devices can be useful for providing tunable electromechanical surface adhesion and/or tactile force sensing in a variety of applications, including without limitation automated materials handling systems, prosthetic hands, and other robotic systems for dexterous gripping of objects. The disclosed adhesive devices can also be used or adapted for use in hanging wall-mounted televisions, picture frames, and the like. A person skilled in the art, in view of the present disclosures, will recognize other uses with which the present teachings can be used to provide gripping, adhesion, and/or holding.

Figure 9B:
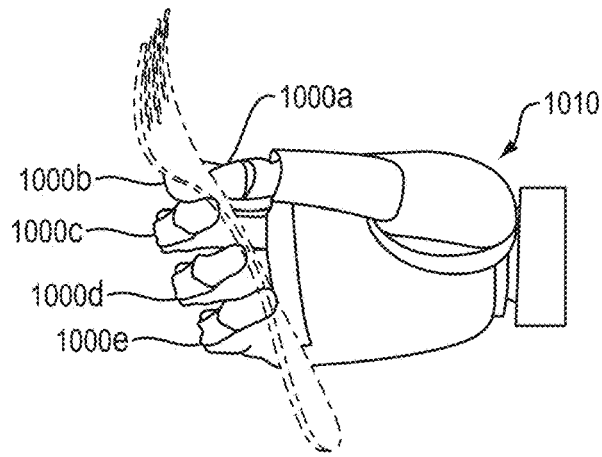
FIG. 9B is a perspective view of one exemplary embodiment of a prosthetic hand that includes 3D electromechanical adhesive devices.

FIG. 9B illustrates one exemplary embodiment of a prosthetic hand 1010 that includes one or more 3D electromechanical adhesive devices 1000 for providing tunable electromechanical adhesion and/or force sensing. In some embodiments, the 3D electromechanical adhesive devices 1000a, 1000b, 1000c, 1000d, and 1000e can be disposed at one or more fingertips of the prosthetic hand 1010.

Figure 9C:
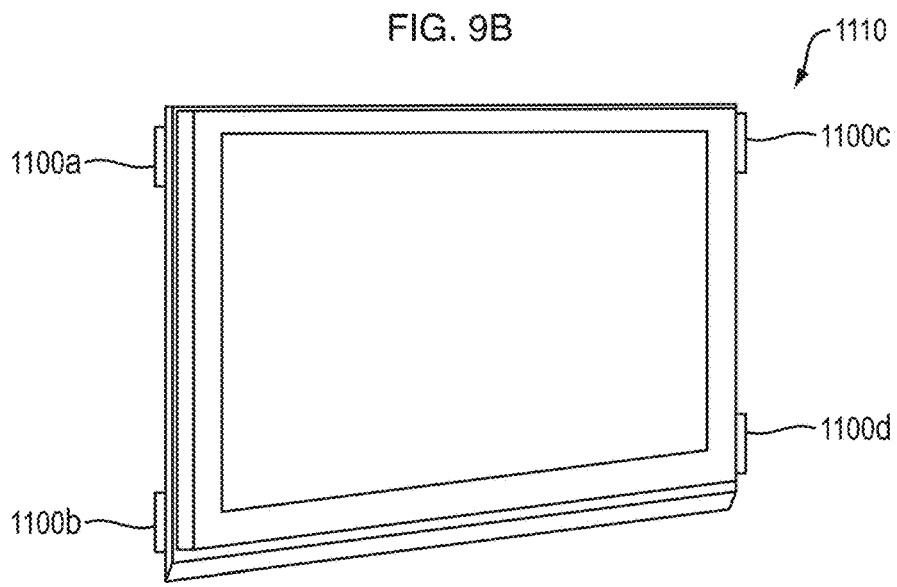
FIG. 9C is a perspective view of one exemplary embodiment of a wall-mounted television that includes 3D electromechanical adhesive devices.

FIG. 9C illustrates one exemplary embodiment of a wall-mounted television 1110 that includes one or more 3D electromechanical adhesive devices 1100 for providing tunable electromechanical adhesion and/or force sensing. In some embodiments, the 3D electromechanical adhesive devices 1100 can be disposed at a rear surface of the television 1110 for mounting on a wall.

The various illustrative logical blocks, modules, circuits, and algorithm operations described in connection with the embodiments disclosed herein may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the claims.

The hardware used to implement the various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of receiver smart objects, e.g., a combination of a DSP and a microprocessor, two or more microprocessors, one or more microprocessors in conjunction with a DSP core, or any other such configuration. Alternatively, some operations or methods may be performed by circuitry that is specific to a given function.

In one or more aspects, the functions described may be implemented in hardware, software, firmware, or any combination thereof. If implemented in software, the functions may be stored as one or more instructions or code on a non-transitory computer-readable storage medium or non-transitory processor-readable storage medium. The operations of a method or algorithm disclosed herein may be embodied in a processor-executable software module or processor-executable instructions, which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storage smart objects, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed embodiments is provided to enable any person skilled in the art to make or use the claims. Various modifications to these embodiments will be readily apparent to those skilled in the art, and the generic principles defined herein may be applied to other embodiments without departing from the scope of the claims. Thus, the present disclosure is not intended to be limited to the embodiments shown herein but is to be accorded the widest scope consistent with the following claims and the principles and novel features disclosed herein.

What is claimed is:

1. A device, comprising:
   a substrate;
   a plurality of three-dimensional conductive microstructures disposed on the substrate and configured to deform when in contact with a surface of an object;
   a dielectric coating disposed on an outer surface of the plurality of conductive microstructures; and
   a plurality of electrodes disposed on the substrate, each electrode of the plurality of electrodes being electrically coupled to at least one of the plurality of conductive microstructures,
   wherein the plurality of conductive microstructures are configured to electromechanically adhere to a surface of an object when voltage is applied to the plurality of conductive microstructures through the plurality of electrodes,
   wherein the device is configured to provide an output for determining a force applied by a surface of an object against the plurality of conductive microstructures, the output being indicative of a change in an electrical property of one or more of the plurality of conductive microstructures, and
   wherein the device is configured to set the voltage that is applied to the plurality of conductive microstructures to induce electromechanical adhesion based on the determined force applied by the surface of the object against the plurality of conductive microstructures.

2. The device of claim 1, wherein the output for determining a force applied by a surface of an object is indicative of at least one of a capacitance or a resistance that changes in response to deformation of one or more of the plurality of conductive microstructures.

3. The device of claim 1, further comprising a controller configured to set the voltage that is applied to the plurality of conductive microstructures to induce electromechanical adhesion based on the determined force applied by the surface of the object against the plurality of conductive microstructures.

4. The device of claim 1, wherein the plurality of conductive microstructures are configured to deform when in contact with a surface of an object such that the plurality of conductive microstructures provide a contact area that conforms substantially to the surface of the object.

5. The device of claim 1, wherein the plurality of conductive microstructures are configured to release the object when the voltage is removed.

6. The device of claim 1, wherein each of the plurality of conductive microstructures includes a plurality of conductive fibers.

7. The device of claim 1, wherein each of the plurality of conductive microstructures includes a plurality of at least one of conductive nanowires, nanorods, or nanotubes.

8. The device of claim 1, wherein at least some conductive microstructures of the plurality of conductive microstructures are slanted or curved with respect to a top surface of the substrate.

9. The device of claim 8, wherein one or more of the at least some conductive microstructures of the plurality of conductive microstructures are slanted or curved with respect to the top surface of the substrate in a substantially identical direction for anisotropic lateral adhesion.

10. The device of claim 8, wherein one or more of the at least some conductive microstructures of the plurality of conductive microstructures are slanted or curved with respect to the top surface of the substrate in different directions for isotropic lateral adhesion.

11. The device of claim 1, wherein the dielectric coating is conformally disposed on the outer surface of the plurality of conductive microstructures.

12. The device of claim 1, wherein the plurality of conductive microstructures are disposed on the substrate in a plurality of groups of conductive microstructures, each group comprising one or more conductive microstructures of the plurality of conductive microstructures.

13. The device of claim 12, wherein the voltage applied to electromechanically adhere the plurality of conductive microstructures to a surface of an object is controlled by selectively applying the voltage to the plurality of groups of conductive microstructures on a per group basis.

14. The device of claim 13, wherein the voltage applied to each of the plurality of groups of conductive microstructures is determined based on a force applied by a surface of an object against the one or more conductive microstructures of that group.

15. The device of claim 14, wherein the device is configured to provide the output for determining a force applied by a surface of an object against each of the plurality of groups of conductive microstructures.

16. The device of claim 15, wherein the output for determining a force applied by a surface of an object against a group of conductive microstructures corresponds to at least one of a capacitance or a resistance that is associated with the group of conductive microstructures.

17. The device of claim 1, wherein the controllable adhesive device is a component of a robotic gripping system.

18. The device of claim 17, wherein the robotic gripping system is wearable.

19. A method of manipulating an object, comprising:
contacting a controllable adhesive device against a surface of an object, the controllable adhesive device comprising a substrate, a plurality of three-dimensional conductive microstructures disposed on the substrate, a dielectric coating disposed on a surface of the plurality of conductive microstructures, and a plurality of electrodes electrically coupled to the plurality of conductive microstructures; and
determining a force applied by the surface of the object against the plurality of conductive microstructures based on a change in an electrical property of one or more of the plurality of conductive microstructures.

20. A robotic gripping system, comprising:
a plurality of movable gripping mechanisms;
a plurality of controllable adhesive devices, each adhesive device being disposed on a surface of a respective one of the plurality of movable gripping mechanisms; and
a controller coupled to the plurality of controllable adhesive devices, wherein each adhesive device comprises:
a substrate;
a plurality of three-dimensional conductive microstructures disposed on the substrate and configured to deform when in contact with a surface of an object;
a dielectric coating disposed on a surface of the plurality of conductive microstructures; and
a plurality of electrodes disposed on the substrate, each of the plurality of electrodes being electrically coupled to at least one of the plurality of conductive microstructures,
wherein the controller is configured to direct application of voltage to the plurality of conductive microstructures through the plurality of electrodes of the adhesive device to induce electromechanical adhesion of at least one of the plurality of controllable adhesive devices to a surface of an object.

* * * * *

UNITED STATES PATENT AND TRADEMARK OFFICE
CERTIFICATE OF CORRECTION

| | |
|---|---|
| PATENT NO. | : 10,919,158 B2 |
| APPLICATION NO. | : 16/268381 |
| DATED | : February 16, 2021 |
| INVENTOR(S) | : Hart et al. |

Page 1 of 1

It is certified that error appears in the above-identified patent and that said Letters Patent is hereby corrected as shown below:

In the Specification

In Column 1, Line 9, after paragraph "RELATED APPLICATIONS" insert heading & paragraph:
--GOVERNMENT SUPPORT
This invention was made with government support under CMMI1463181 awarded by the National Science Foundation. The government has certain rights in the invention.--

Signed and Sealed this
Ninth Day of December, 2025

John A. Squires
*Director of the United States Patent and Trademark Office*